United States Patent [19]
Matsumoto et al.

[11] Patent Number: 4,746,984
[45] Date of Patent: May 24, 1988

[54] SOLID STATE IMAGE SENSOR WITH LATERAL-TYPE STACTIC INDUCTION TRANSISTORS

[75] Inventors: Kazuya Matsumoto; Tsutomu Nakamura, both of Ina, Japan

[73] Assignee: Olympus Optical Co., Ltd., Japan

[21] Appl. No.: 853,876

[22] Filed: Apr. 21, 1986

[30] Foreign Application Priority Data

Apr. 24, 1985 [JP] Japan .................................. 60-86530
May 20, 1985 [JP] Japan ................................ 60-107248

[51] Int. Cl.⁴ .................................................. H04N 3/14
[52] U.S. Cl. ............................ 358/213.12; 358/213.16
[58] Field of Search ................... 358/213, 221, 213.11, 358/213.15, 213.16, 213.31; 357/30, 24 LR

[56] References Cited
U.S. PATENT DOCUMENTS 4,300,151 11/1981 Nishizawa ...................... 357/24 LR
4,518,863 5/1985 Fukuoka et al. ..................... 358/213
4,525,742 6/1985 Nishizawa et al. .................. 358/213
4,531,156 7/1985 Nishizawa et al. .................. 358/213
4,587,562 5/1986 Imai et al. ........................... 358/213
4,593,320 6/1986 Nishizawa et al. ............ 357/24 LR Primary Examiner—Jin F. Ng
Assistant Examiner—Stephen Brinich
Attorney, Agent, or Firm—Parkhurst & Oliff

[57] ABSTRACT

A solid state image sensor having a number of pixels each including a lateral type static induction transistor (LSITs) and arranged in matrix of mxn, gate terminals of LSITs arranged on respective rows are connected to outputs of a vertical scanning circuit to receive selection signals $\phi_{G1}$, $\phi_{G2}$ ... $\phi_{Gm}$ successively, drain terminals of all LSITs being commonly connected to a video bias voltage source and source terminals of LSITs aligned on respective columns being connected to the ground potential via a load resistor by means of column selection transistors whose gate terminals are connected to outputs of a horizontal scanning circuit to receive selection signals $\phi_{S1}$, $\phi_{S2}$ ... $\phi_{Sn}$ successively. Respective LSITs are selected by the source-gate selection method and a video signal is derived by a source follower configuration.

23 Claims, 9 Drawing Sheets

FIG_1
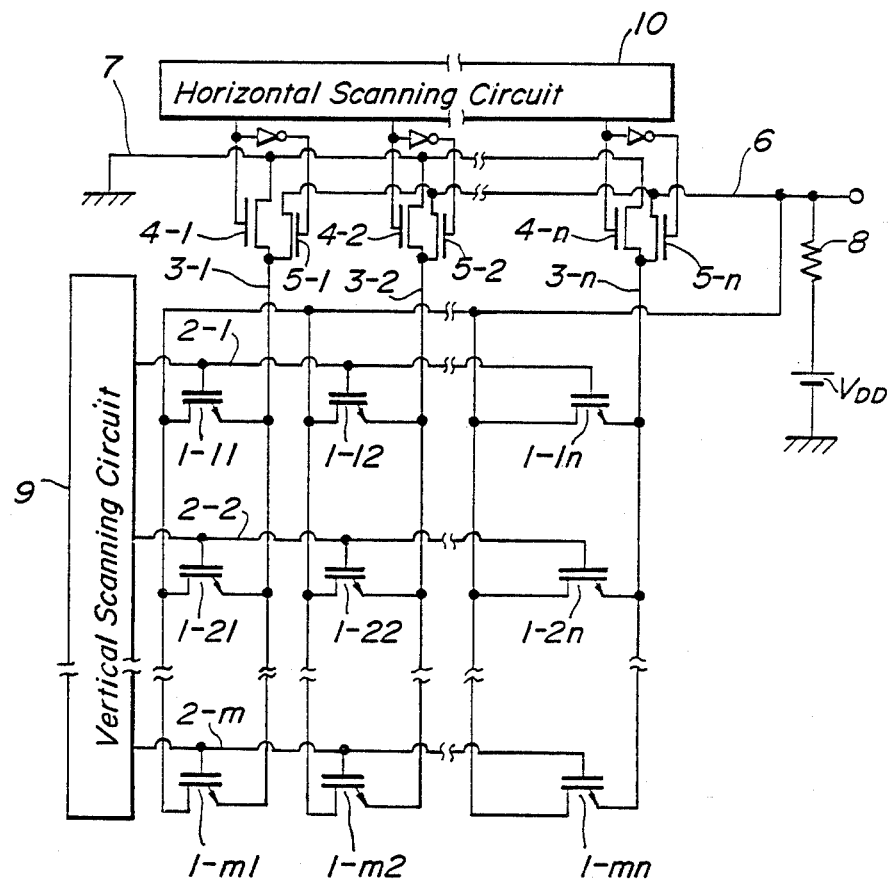

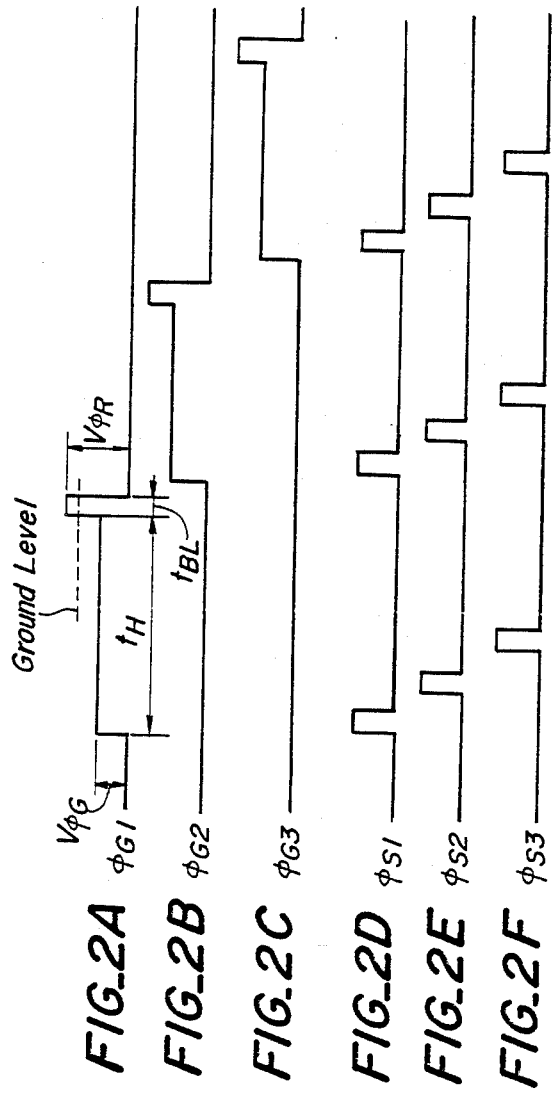

FIG_3
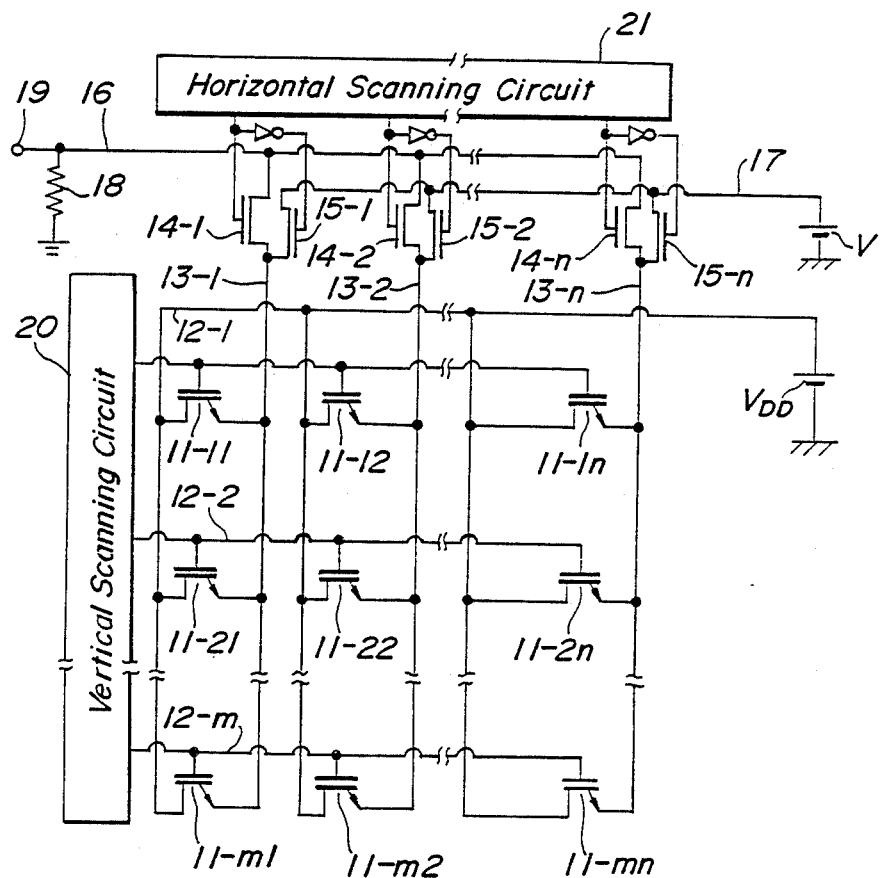

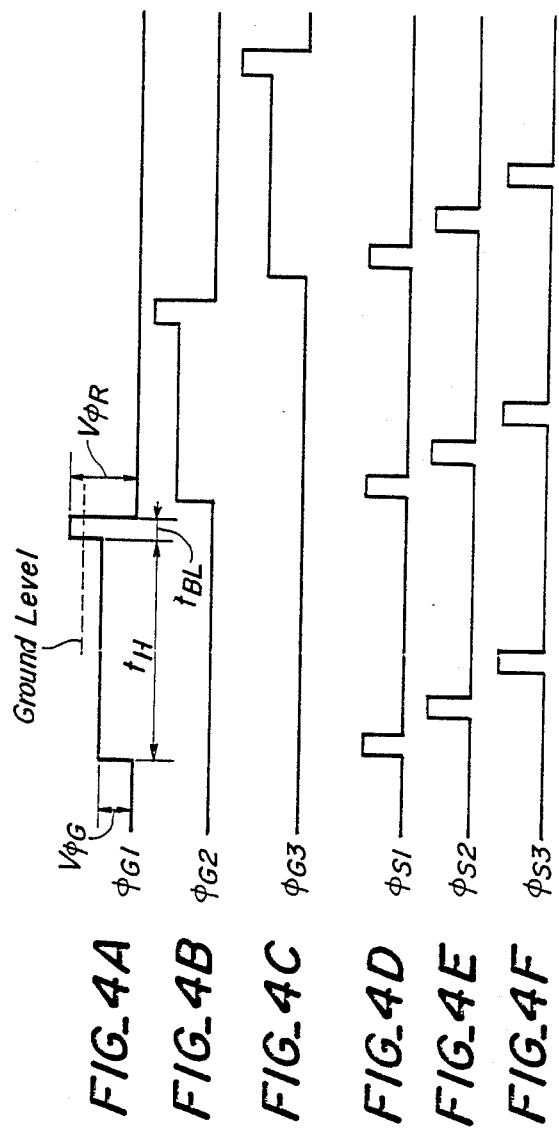

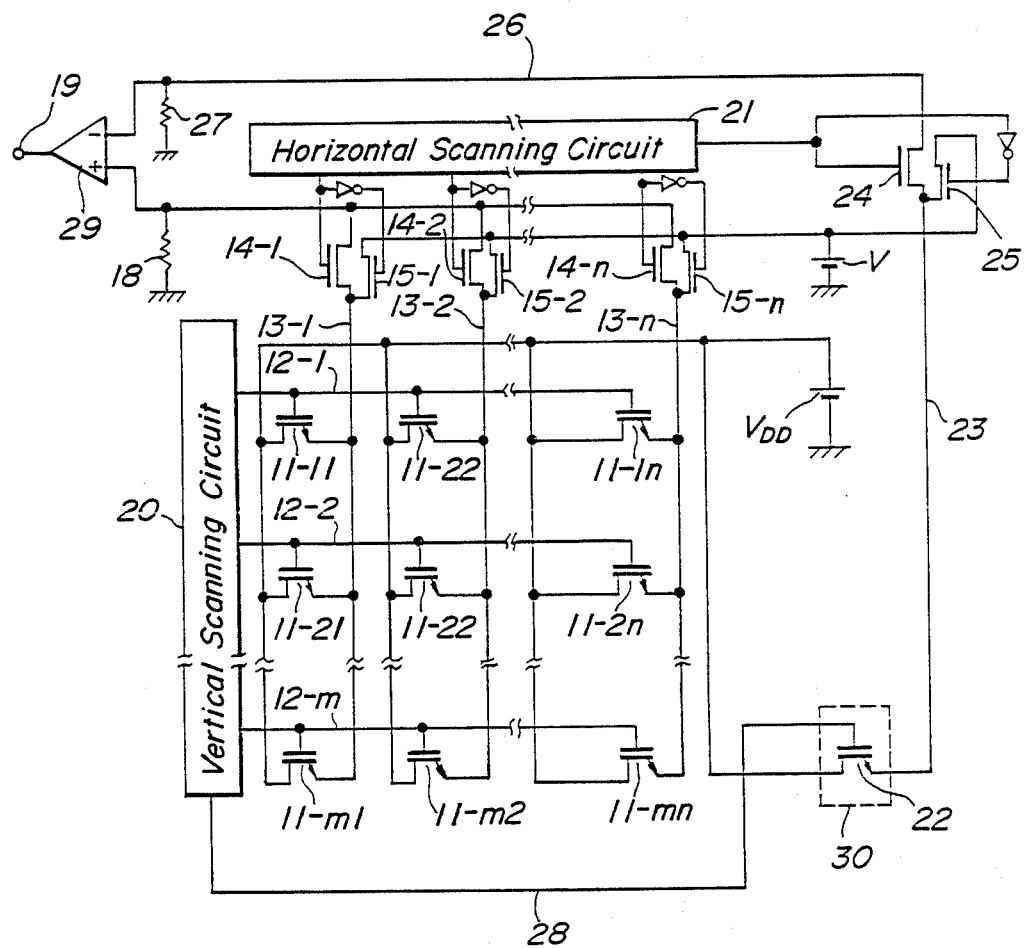
FIG_5

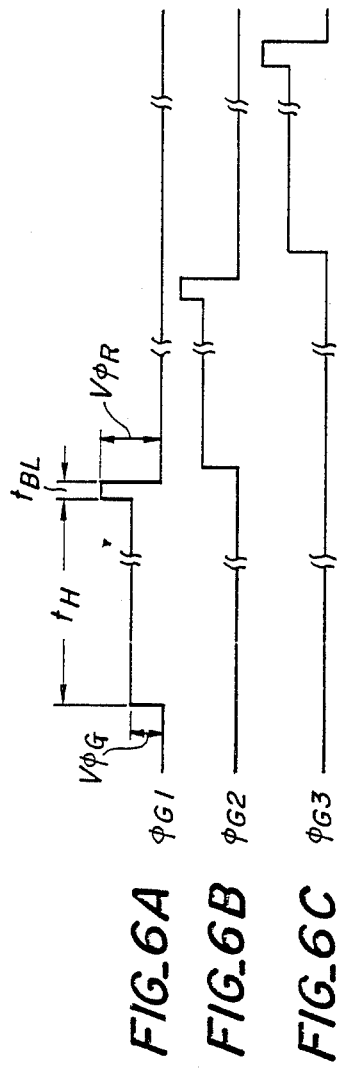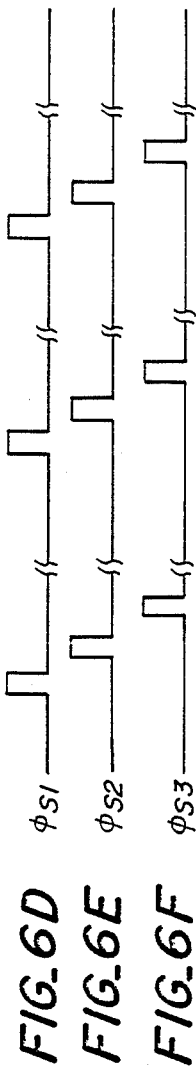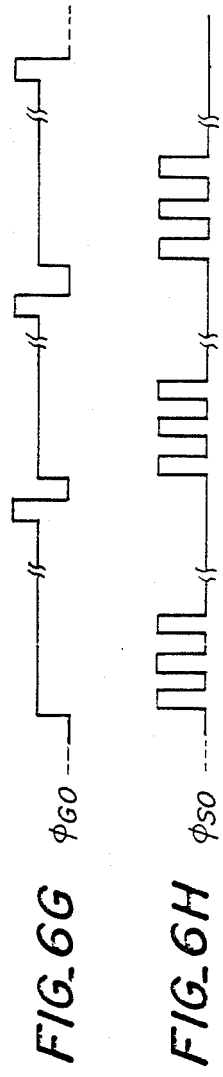

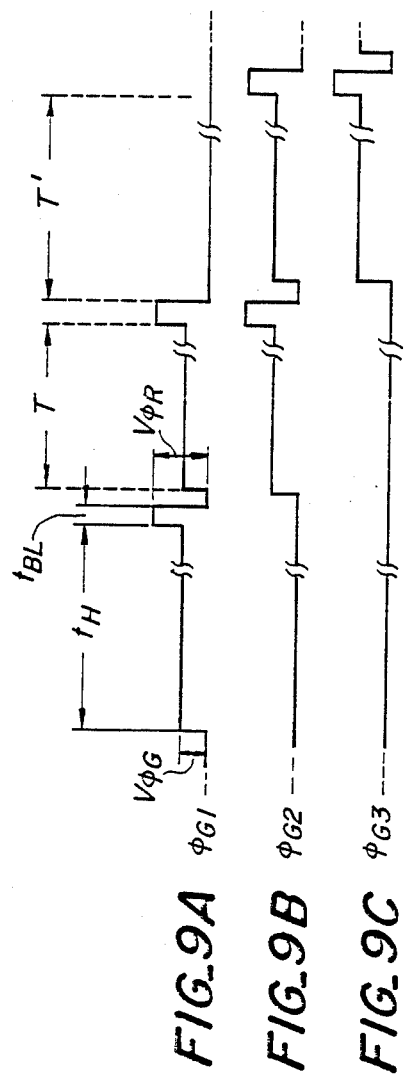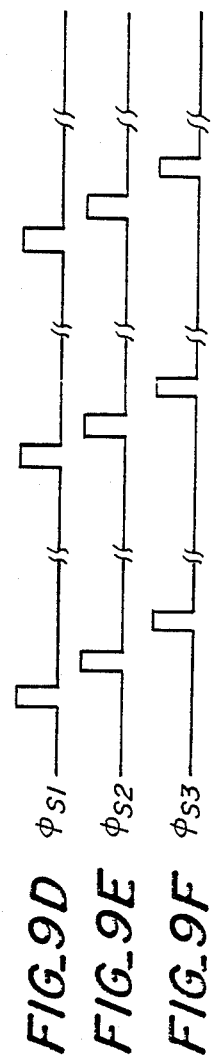
FIG.9A $\phi_{G1}$
FIG.9B $\phi_{G2}$
FIG.9C $\phi_{G3}$
FIG.9D $\phi_{S1}$
FIG.9E $\phi_{S2}$
FIG.9F $\phi_{S3}$

SOLID STATE IMAGE SENSOR WITH LATERAL-TYPE STACTIC INDUCTION TRANSISTORS

BACKGROUND OF THE INVENTION

Field of the Invention and Related Art Statement

The present invention relates to a solid state image sensor comprising a number of pixels each including at least one lateral type static induction transistor in which a source-drain current flows in parallel with a major surface of a semiconductor substrate.

The inventors of the instant application have proposed a solid state image sensor comprising lateral type static induction transistors (hereinafter abbreviated as LSIT) in a U.S. patent application Ser. No. 715,641 filed on Mar. 25, 1985 and assigned to the same assignor to which the instant application was assigned. In this solid state image sensor a number of LSITs are arranged in matrix and are successively readout by means of drain-gate selection method, source-gate selection method and source-drain selection method. Among these three selection methods the source-gate selection method has been found most preferable in view of the miniaturization of pixel areas.

FIG. 1 is a circuit diagram showing the solid state image snesor disclosed in said copending application. The solid state image sensor comprises LSITs 1-11, 1-12, ... 1-mn forming pixels arranged in matrix and these LSITs are successively selected by the source-gate selection method and an output signal of a selected pixel is readout by means of a common source configuration. Gate terminals of LSITs arranged in the X direction on respective rows are connected to row lines 2-1, 2-2 ... 2-m, respectively. Source terminals of LSITs arranged in the Y direction along respective columns are connected to column lines 3-1, 3-2 ... 3-n, respectively. The column lines 3-1, 3-2 ... 3-n are connected on one hand to a video line 6 via column selection transistors 4-1, 4-2 ... 4-n, respectively and on the other hand to a ground potential line 7 via anti-selection transistors 5-1, 5-2 ... 5-n, respectively. The video line 6 is connected by means of a load resistor 8 to a video voltage supply source $V_{DD}$. All drains of LSITs 1-11~1-mn are commonly connected to the video line 6, so that the video bias voltage $V_{DD}$ is applied to drain electrodes of LSITs 1-11~1-mn. The row lines 2-1, 2-2 ... 2-m are connected to output terminals of a vertical scanning circuit 9 generating signals $\phi_{G1}$, $\phi_{G2}$ ... $\phi_{Gm}$, respectively. Gate terminals of the column selection transistors 4-1, 4-2 ... 4-n and anti-selection transistors 5-1, 5-2 ... 5-n are coupled with outputs of a horizontal scanning circuit 10 generating signals $\phi_{S1}$, $\phi_{S2}$ ... $\phi_{Sn}$ directly and via inverters, respectively.

Now the operation of the solid state image sensor shown in FIG. 1 will be explained also with reference to signal waveforms illustrated in FIGS. 2A to 2F. As shown in FIGS. 2A to 2C, each of the signals $\phi_{G1}$, $\phi_{G2}$ ... applied to the row lines is formed by a readout gate voltage $V_{\phi G}$ having a small amplitude and a reset voltage $V_{\phi R}$ having an amplitude higher than the voltage $V_{\phi G}$. During a line scanning period $t_H$, the signal assumes the lower voltage $V_{\phi G}$, and during a blanking period $t_{BL}$ the signal assumes the higher voltage $V_{\phi R}$. As illustrated in FIGS. 2D to 2F, the horizontal scanning signals $\phi_{S1}$, $\phi_{S2}$ ... applied to the gate terminals of the column selection transistors 4-1, 4-2 ..., respectively have a lower level at which the column selection transistors 4-1, 4-2 ... are made cut-off and the anti-selection transistors 5-1, 5-2 ... are made conductive, and a higher level at which the column selection transistors 4-1, 4-2 ... are made conductive, but the anti-selection transistors 5-1, 5-2 ... are made non-conductive.

When the signal $\phi_{G1}$ applied to the first row line 2-1 assumes the read out level $V_{\phi G}$, LSITs 1-11, 1-12 ... 1-1n connected to the row line 2-1 are selected. When the column selection transistors 4-1, 4-2 ... 4-n are made successively conductive by means of the signals $\phi_{S1}$, $\phi_{S2}$ ... $\phi_{Sn}$ supplied from the horizontal scanning circuit 10, video signals are readout of the successive LSITs 1-11, 1-12 ... 1-1n on the video line 6. These LSITs are simultanteously reset when the signal $\phi_{G1}$ becomes the higher level $V_{\phi R}$. Next, when the signal $\phi_{G2}$ assumes the lower level $V_{\phi G}$, LSITs 1-21, 1-22 ... 1-2n connected to the second row line 2-2 are selected and then are successively readout by means of the horizontal scanning signals $\phi_{S1}$, $\phi_{S2}$ ... $\phi_{Sn}$. Then all the LSITs 1-21, 1-22 ... 1-2n are simultaneously reset when the signal $\phi_{G2}$ assumes the higher level $V_{\phi R}$. In the manner explained above, the LSITs are successively readout to derive a video signal of one field.

In the solid state image sensor explained above, a constant reverse bias voltage $V_R$ is always applied to a semiconductor substrate in which LSITs are integrally formed, and the video bias voltage $V_{DD}$ is applied to LSITs belonging to a selected row, but being not readout. Therefore, the substrate-drain-source constitutes PIN diode having a voltage $V_R + V_{DD}$ applied thereto. This results in a serious problem that when an LSIT belonging to a row is to be read out, in addition to a video signal readout of the relevant LSIT currents flowing through PIN diodes constituted by the remaining LSITs belonging to the same row are simultaneously readout on the video line 6. It is apparent that the currents flowing through the PIN diodes are noise for the video signal and thus S/N of the readout video signal is reduced to a large extent. It should be noted that the diode current becomes large in proportion to the number of LSITs arranged in a row. Moreover, the column lines 3-1, 3-2 ... 3-n assume a potential difference of $V_{DD}$ between a time of selection and a time of non-selection, so that charging and discharging time constants at respective lines become large and a response speed of the solid state image sensor becomes low.

Moreover, in the solid state image sensor mentioned above, since a dark current is superimposed upon the video signal, the S/N of the video signal is further decreased. In order to eliminate the influence of the dark current, it is necessary to provide an external signal processing circuit for substrating the dark current from the readout video signal. However, since the dark current varies from pixel to pixel as well as from chip to chip, the signal processing circuit becomes complicated in construction and expensive in cost.

SUMMARY OF THE INVENTION

The present invention has for its object to provide a novel and useful solid state image sensor which comprises a great large number of LSITs arranged at a high density and can readout a video signal having a high S/N at a high speed.

According to the invention, a solid state image sensor comprises a semiconductor substrate having a major surface;

a number of lateral type static induction transistors constituting pixels and arranged in said semiconductor substrate in matrix, each of said lateral type static induction transistors comprising source and drain regions formed in said major surface of the substrate in such a configuration that a source-drain current flows in parallel with the major surface of the substrate; and scanning means for selecting said lateral type static induction transistors successively by a source-gate selection method and for reading out a video signal from a selected lateral type static induction transistor by a source follower configuration.

In a preferred embodiment of the solid state image sensor according to the invention, gate terminals of LSITs arranged on respective rows are connected to respective row lines connected to a vertical scanning circuit, drain terminals of all the LSITs are commonly connected to a video bias voltage source and source terminals of LSITs arranged on respective column lines are selectively connectable to a load resistor via respective column selection transistors which are driven by a horizontal scanning circuit.

In another preferable embodiment of the solid state image sensor according to the invention, there is further provided at least one light shielded LSIT for generating a dark current and a differential output between a video signal and the dark current is derived by reading out said light shielded LSIT every time the LSITs in the matrix are successively readout.

BRIEF DESCRIPTION OF THE DRAWINGS

FIG. 1 is a circuit diagram showing the solid state image sensor disclosed in the copending patent application;

FIGS. 2A to 2F are signal waveforms for explaining the operation of the solid state image sensor illustrated in FIG. 1;

FIG. 3 is a circuit diagram illustrating an embodiment of the solid state image sensor according to the invention;

FIGS. 4A to 4F are signal waveforms for explaining the operation of the image sensor of FIG. 3;

FIG. 5 is a circuit diagram depicting another embodiment of the solid state image sensor according to the invention;

FIGS. 6A to 6H are signal waveforms for explaining the operation of the image sensor shown in FIG. 5;

FIGS. 9A to 9F are signal waveforms for explaining the operation of the image sensor shown in FIG. 8.

DESCRIPTION OF THE PREFERRED EMBODIMENTS

Figure 7:
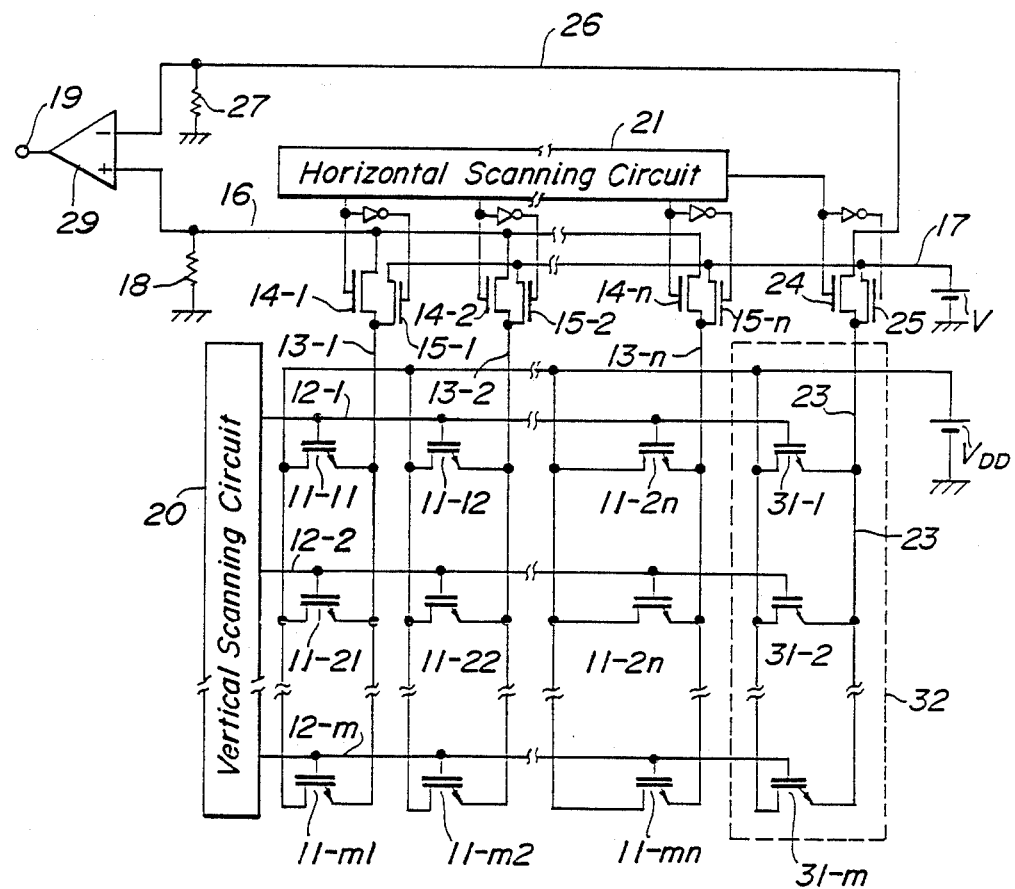
FIG. 7 is a circuit diagram showing another embodiment of the solid state image sensor according to the invention.

FIG. 3 is a circuit diagram showing a construction of an embodiment of the solid state image sensor according to the invention. The solid state image sensor comprises a number of LSITs 11-11, 11-12 . . . 11-mn arranged in matrix and formed in a semiconductor substrate. Each of the LSITs constitutes a pixel and comprises source and drain regions formed in a major surface of the substrate in such a manner that a source-drain current flows in parallel with the major sruface of the semiconductor substrate. Such a lateral type static induction transistor has been explained in the copending U.S. patent application Ser. No. 715,641. Drain terminals of all the LSITs 11-11, 11-12 . . . 11-mn are commonly connected to a video bias voltage source $V_{DD}$ (>0). Gate terminals of LSITs arranged in respective rows are connected to row lines 12-1, 12-2 . . . 12-m, respectively. Source terminals of LSITs arranged in respective columns are connected to column lines 13-1, 13-2 . . . 13-n, respectively. The column lines 13-1, 13-2 . . . 13-n are connected to a video line 16 via column selection transistors 14-1, 14-2 . . . 14-n as well as to a line 17 via anti-selection transistors 15-1, 15-2 . . . 15-n. The line 17 is connected to the ground potential via a voltage source V ($\geq$0). The video line 16 is connected to the ground potential by means of a load resistor 18, and a connection point between the video line and the load resistor is connected to an output terminal 19 from which a video signal is derived. The row lines 12-1, 12-2 . . . 12-n are connected to a vertical scanning circuit 20 to receive signals $\phi_{G1}$, $\phi_{G2}$ . . . $\phi_{Gm}$, respectively. Gate terminals of the column selection transistors 14-1, 14-2 . . . 14-n are directly connected to outputs of a horizontal scanning circuit 21 to receive signals $\phi_{S1}$, $\phi_{S2}$ . . . $\phi_{Sn}$, while gate terminals of the anti-selection transistors 15-1, 15-2 . . . 15-n are connected to the outputs of the horizontal scanning circuit 21 via inverters to receive inversed signals of the signals $\phi_{S1}$, $\phi_{S2}$ . . . $\phi_{Sn}$. As stated above the LSITs are integrally formed in the semiconductor substrate to which is applied a negative voltage $V_{SUB}$ (<0).

FIGS. 4A to 4F are signal waveforms for explaining the operation of the solid state image sensor shown in FIG. 3. Signals $\phi_{G1}$, $\phi_{G2}$ . . . applied to the row lines 12-1, 12-2 . . . , respectively assume a gate voltage $V_{\phi G}$ having a small amplitude during a line scanning period $t_H$ and a voltage $V_{\phi R}$ having a higher amplitude during a blanking period $t_{BL}$. Signals $\phi_{S1}$, $\phi_{S2}$ . . . applied to the gate terminals of the column selection transistors 14-1, 14-2 . . . 14-n have a lower level which makes the column selection transistors 14-1, 14-2 . . . 14-n non-conductive, but the anti-selection transistors 15-1, 15-2 . . . 15-n conductive and a high level which brings the column selection transistors conductive, but the anti-selection transistors non-conductive. It sould be noted that the signals shown in FIGS. 4A to 4F are used when the voltage V applied to the line 17 is zero, i.e. the line 17 is connected to the ground potential. If V>0, the reset voltage $V_{\phi R}$ of the signals $\phi_{G1}$, $\phi_{G2}$ . . . $\phi_{Gn}$ has to be increased in the positive direction.

When the signal $\phi_{G1}$ supplied from the vertical scanning circuit 20 is increased to the readout level $V_{\phi G}$, LSITs 11-11, 11-12 . . . 11-1n connected to the first row line 12-1 are selected. When the column selection transistors 14-1, 14-2 . . . 14-n are made successively conductive by means of the signals $\phi_{S1}$, $\phi_{S2}$ . . . $\phi_{Sn}$ supplied from the horizontal scanning circuit 21, these LSITs are successively readout and video signals are derived at the output terminal 19 via the video line 16. Then the LSITs 11-11, 11-12 . . . 11-1n are simultaneously reset when the signal $\phi_{G1}$ assumes the reset voltage $V_{\phi R}$. Next the signal $\phi_{G2}$ assumes the readout voltage $V_{\phi G}$ and LSITs 11-21, 11-22 . . . 11-2n belonging to the second row line 12-2 are selected and are successively readout in response to the signals $\phi_{S1}$, $\phi_{S2}$ . . . $\phi_{Sn}$. Then all the LSITs 11-21, 11-22 . . . 11-2n are reset simultaneously. The same operation is carried out to readout all the LSITs successively to derive a video signal of one field from the output terminal 19.

In the above embodiment, in order to fix the source terminals of non-selected LSITs at a stable potential, there are provided the anti-selection transistors 15-1, 15-2 . . . 15-n. However, in a modified embodiment, the anti-selection transistors are dispensed with. Even in such a case, it is possible to store photocarries in gate regions of LSITs. Moreover, the readout voltage $V_{\phi G}$ of the gate signal may be identical with a voltage during the photocarrier storing period.

According to the present invention, since the LSITs constituting the pixels are selected by the source-gate selection method, it is no more necessary to provide an isolation region between the pixels. Therefore, the dimension of pixels can be reduced and a great large number of pixels can be integrated at a very high density. Further since the influence of drain stray capacitance can be reduced and a load capacitance of the column lines can be decreased, it is possible to effect the high speed readout. Moreover, since the video signal is readout by the source follower configuration, it is possible to obtain the video signal having a high S/N. Further the potential variation of the column lines between the selection period and the non-selection period can be decreased, and therefore the readout operation can be performed at a high speed.

FIG. 5 is a circuit diagram showing another embodiment of the solid state image sensor according to the invention. In the present embodiment elements which are similar to those shown in FIG. 3 are denoted by the same reference numerals used in FIG. 3 and their detailed explanation is omitted.

In the present embodiment, there is formed a single dummy pixel 22 in the semiconductor substrate and a light shielding film 30 such as an aluminum film is deposited above the dummy pixel. The dummy pixel 22 is formed by LSIT whose drain terminal is connected to the video bias voltage source $V_{DD}$ and whose source terminal is connected to a line 23 which is connected, on one hand, to a dark current readout line 26 via a selection transfer 24 and, on the other hand, to the line 17 through an anti-selection transistor 25. The dark current readout line 26 is further connected to the ground potential by means of a load resistor 27 having the same resistance as that of the load resistor 18 connected to the video line 16. A gate terminal of the dummy LSIT 22 is connected to an additional output of the vertical scanning circuit 20 by means of a line 28. The vertical scanning circuit 20 generates a logic sum signal $\phi_{G0}$ of the signals $\phi_{G1}, \phi_{G2} \ldots \phi_{Gm}$ applied to the row lines 12-1 12-2 . . . 12-m, respectively. Gate terminals of the selection transistor 24 and anti-selection transistor 25 are connected to an additional output of the horizontal scanning circuit 21 directly and via an inverter, respectively. The horizontal scanning circuit 21 generates a logic sum signal $\phi_{S0}$ of the signals $\phi_{S1}, \phi_{S2} \ldots \phi_{Sn}$ applied to the gate terminals of the column selection transistors 14-1, 14-2 . . . 14-n, respectively. A connection point of the video line 16 and load resistor 18 and a connection point of the dark current readout line 26 and load resistor 27 are connected to positive and negative inputs of a differential amplifier 29, respectively, so that a difference between a video signal readout of a selected LSIT and a dark current readout of the dummy LSIT 22 is derived at the output terminal.

FIGS. 6A to 6H are signal waveforms for explaining the operation of the solid state image sensor illustrated in FIG. 5. The signals $\phi_{G1}, \phi_{G2}, \phi_{G3}$ shown in FIGS. 6A to 6C are same as those shown in FIGS. 4A to 4C and signals $\phi_{S1}, \phi_{S2}, \phi_{S3}$ illustrated in FIGS. 6D to 6F are identical with those illustrated in FIGS. 4D to 4F. The signal $\phi_{G0}$ shown in FIG. 6G is the logical sum of the signals $\phi_{G1}, \phi_{G2} \ldots \phi_{Gm}$ and is applied to the gate terminal of the dummy LSIT 22 via the line 28. The signal $\phi_{S0}$ illustrated in FIG. 6H is a logical sum of the signals $\phi_{S1}, \phi_{S2} \ldots \phi_{Sn}$ applied to the column selection transistors 14-1, 14-2 . . . 14-n, respectively. When the signal $\phi_{S0}$ assumes a high level the selection transistor 24 is made conductive, but the anti-selection transistor 25 is made non-conductive.

When the signal $\phi_{G1}$ is changed to the readout level $V_{\phi G}$, LSITs 11-11, 11-12 . . . 11-1n connected to the first row line 12-1 are selected. At the same time, the dummy LSIT 22 is made enable by means of the signal $\phi_{G0}$. When the horizontal scanning circuit 21 generates the signals $\phi_{S1}, \phi_{S2} \ldots \phi_{Sn}$ successively, the column selection transistors 14-1, 14-2 . . . 14-n are made conductive successively and the LSITs 11-11, 11-12 . . . 11-1n are successively readout. Each time the LSITs 11-11, 11-12 . . . 11-1n are readout, the dummy LSIT 22 is repeatedly readout by means of the signal $\phi_{S0}$. In this manner video signals readout of the LSITs 11-11, 11-12 . . . 11-1n, successively are derived on the video line 16 and are supplied to the non-inverted input of the differential amplififer 29, and at the same time a dark current signal is derived on the line 26 and is supplied the inverted input of the differential amplifier 29. Therefore, at the output terminal there is derived the video signal from which the dark current has been subtracted. After the readout of the first line, the LSITs 11-11, 11-12 . . . 11-1n and the dummy LSIT 22 are simultaneously reset by means of the reset voltage $V_{\phi R}$. Then LSITs 11-21, 11-22 . . . 11-2n belonging to the second row line 12-2 are selected and are readout successively, while the dummy LSIT 22 is also selected and readout, so that a video signal of a second line is derived at the output terminal 19 and the influence of the dark current has been removed. In the manner explained above all the LSITs 11-11, 11-12 . . . 11-mn are successively readout and the video signal of one field can be obtained at the output terminal 19, while the dark current has been removed from the video signal.

In the present embodiment, the single light shielded dummy pixel is formed in the semiconductor chip in which the pixels are formed integrally. Further, since the differential amplifier 29 is also formed integrally in the same chip, it is no more necessary to provide any external signal processing circuit for removing the influence of the dark current.

FIG. 7 is a circuit diagram showing another embodiment of the solid state image sensor according to the invention. In the present embodiment, there are provided a dummy pixel column covered with a light shielding film 32. The dummy pixel array comprises dummy LSITs 31-1, 31-2 . . . 31-m whose drain terminals are commonly connected to the video voltage source $V_{DD}$. Gate terminals of the dummy LSITs are connected to respective row lines 12-1, 12-2 . . . 12-m so as to receive the signals $\phi_{G1}, \phi_{G2} \ldots \phi_{Gm}$. Source terminals of the dummy LSITs are commonly connected, on one hand, to the line 23 which is connected to the line 26 via the selection transistor 24 and on the other hand, to the line 17 via the anti-selection transistor 25. The remaining construction of the solid state image sensor shown in FIG. 7 is the same as the embodiment illustrated in FIG. 5.

When the signal $\phi_{G1}$ assumes the readout level $V_{\phi G}$, LSITs 11-11, 11-12 ... 11-1n and dummy LSIT 31-1 belonging to the first row line 12-1 are selected and the selected LSITs are successively readout by means of the signals $\phi_{S1}$, $\phi_{S2}$ ... $\phi_{Sn}$. At the same time the dummy LSIT 31-1 is repeatedly readout by means of the logical sum signal $\phi_{SO}$ in synchronism with the readout operation for the LSITs 11-11, 11-12 ... 11-1n. In this manner, the dark current is subtracted from the output signal readout of the LSITs 11-11, 11-12 ... 11-1n and the video signal having the dark current removed therefrom is derived at the output terminal 19 by means of the differential amplifier 29. After the readout operation for the first line has been completed, the LSITs 11-11, 11-12 ... 11-1n and the dummy LSIT 31-1 are simultaneously reset. In the manner explained above, the successive lines are readout to derive the video signal of one field, while the dark current is subtracted from the readout video signal.

In the present embodiment, a plurality of dummy pixels are provided for respective row lines and are readout in synchronism with the readout operation for LSITs belonging to respective row lines. Therefore, a charge storing time period for each pixels can be made equal to a charge storing time period for the dummy pixels, and therefore the influence of the dark current can be removed very precisely and the video signal having a very high S/N can be obtained.

In the embodiment shown in FIG. 7, the dummy pixel array is provided on the right hand side of the pixel matrix, it may be arranged at any desired position of the semiconductor substrate.

Figure 8:
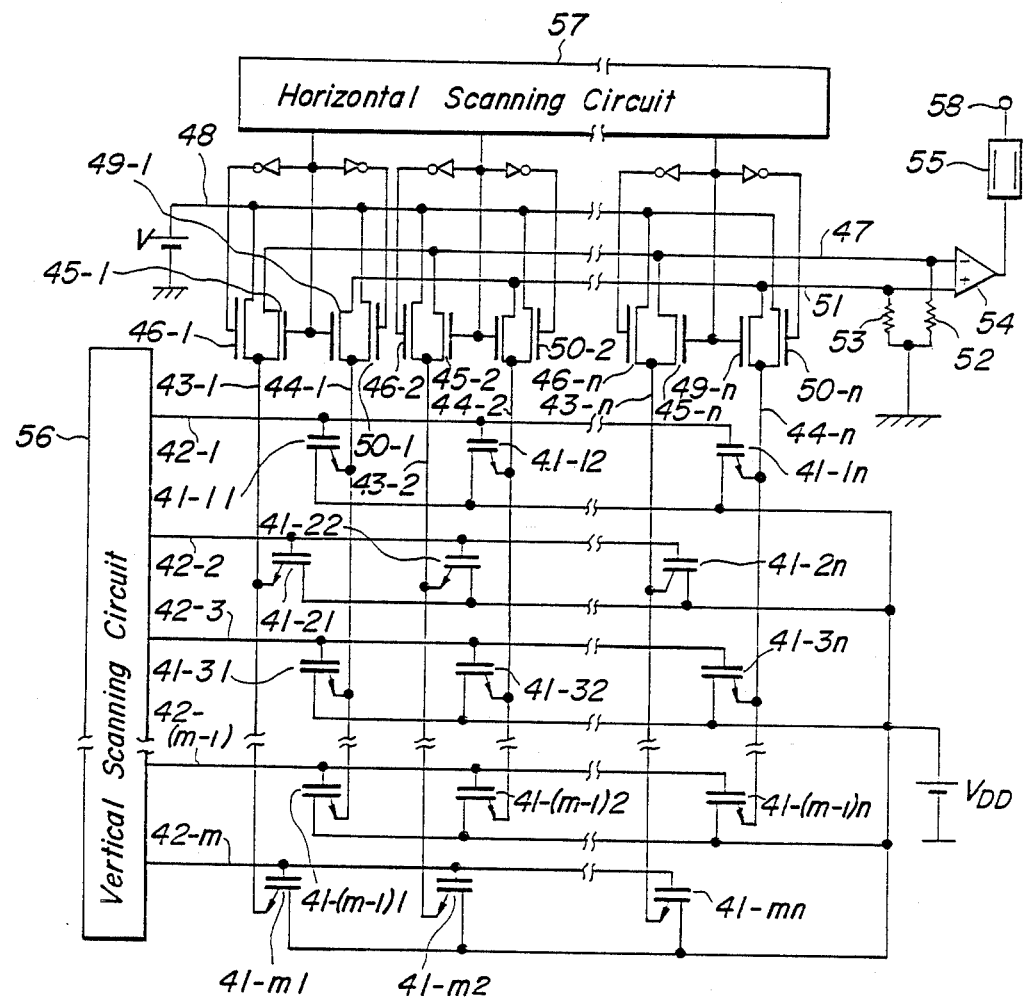
FIG. 8 is a circuit diagram illustrating still another embodiment of the solid state image sensor acording to the invention.

FIG. 8 is a circuit diagram illustrating still another embodiment of the solid state image sensor according to the invention. In the present embodiment, there is not provided a dummy pixel for the dark current correction, and the dark current for a pixel is readout of a pixel preceding the relevant pixel by one row on the same column.

LSITs 41-11, 41-12 ... 41-mn constituting pixels are arranged in matrix, and drain terminals of these LSITs are commonly connected to a video bias voltage source $V_{DD}$ (>0). Gate terminals of LSITs arranged on respective lines are connected to respective row lines 42-1, 42-2 ... 42-m. Source terminals of LSITs aligned on respective columns are alternately connected column lines 43-1, 44-1; 43-2, 44-2 ... 43-n, 44-n. The column lines 43-1, 43-2 ... 43-n are connected, on one hand, to a first video line 47 via column selection transistors 45-1, 45-2 ... 45-n, respectively and, on the other hand, to a line 48 by means of anti-selection transistors 46-1, 46-2 ... 46-n. The line 48 is further connected to a voltage source V ($\geq$0). The column lines 44-1, 44-2 ... 44-n are connected, on one hand, to a second video line 51 through column selection transistors 49-1, 49-2 ... 49-n, respectively and, on the other hand, to the line 48 via anti-selection transistors 50-1, 50-2 ... 50-n, respectively. The first and second video lines 47 and 51 are coupled with the ground potential by means of load resistors 52 and 53 having the same resistance value. Connection points between the video lines 47, 51 and load resistors 52, 53 are connected to positive and negative inputs of a differential amplifier 54. An output signal from the differential amplifier 54 is supplied to an output terminal 58 via an absolute circuit 55. The row lines 42-1, 42-2 ... 42-m are connected to outputs of a vertical scanning circuit 56 to receive signals $\phi_{G1}$, $\phi_{G2}$ ... $\phi_{Gm}$. Gate terminals of the column selection transistors 45-1, 49-1; 45-2, 49-2 ... 45-n, 49-n are commonly connected to outputs of a horizontal scanning circuit 57 to receive signals $\phi_{S1}$, $\phi_{S2}$ ... $\phi_{Sn}$, respectively. Gate terminals of the anti-selection transistors 46-1, 50-1; 46-2, 50-2 ... 46-n, 50-n are coupled with the outputs of the horizontal scanning circuit 57 through inverters so as to receive inverted signals.

FIGS. 9A to 9F are signal waveforms for explaining the operation of the solid state image sensor illustrated in FIG. 8. As illustrated in FIGS. 9A to 9C, the signals $\phi_{G1}$, $\phi_{G2}$ ... $\phi_{Gm}$ assume a readout voltage $V_{\phi G}$ during successive two line scanning periods $t_H$, and assume a reset voltage $V_{\phi R}$ during successive two blanking periods $t_{BL}$. The signals $\phi_{S1}$, $\phi_{S2}$ ... $\phi_{Sn}$ shown in FIGS. 9D to 9F are the same as those of the previous embodiments.

When the signals $\phi_{G1}$ and $\phi_{G2}$ assume the readout voltage $V_{\phi G}$ simultaneously during a period T, LSITs 41-11, 41-12 ... 41-1n and 41-21, 41-22 ... 41-2n are selected. When the column selection transistors 45-1, 49-1; 45-2, 49-2 ... 45-n, 49-n are successively made conductive by means of the signals $\phi_{S1}$, $\phi_{S2}$ ... $\phi_{Sn}$ supplied from the horizontal scanning circuit 57, video signals readout of LSITs 41-21, 41-22 ... 41-2n belonging to the second row line 42-2 are successively derived on the first video line 47, and at the same time video signals readout of LSITs 41-11, 41-12 ... 41-1n belonging to the first row line 42-1 are successively derived on the second video line 51 in synchronism with the video signals readout of the LSITs 41-21, 41-22 ... 41-2n. It should be noted that the LSITs 41-11, 41-12 ... 41-1n belonging to the first line 42-1 have been just reset by means of the reset voltage $V_{\phi R}$ of the signal $\phi_{G1}$, the video signals readout of these LSITs 41-11, 41-12 ... 41-1n are equivalently equal to dark currents. Therefore, when a difference between the video signals on the first and second video lines 47 and 51 is derived by the differential amplifier 54, it is possible to obtain a video signal having the influence of dark current removed therefrom.

Then, the LSITs belonging to the first and second row lines 42-1 and 42-2 are simultaneously reset when the signals $\phi_{G1}$ and $\phi_{G2}$ assume the reset voltage $V_{\phi R}$ in synchronism with each other. Next, the signals $\phi_{G2}$ and $\phi_{G3}$ assume the readout voltage $V_{\phi G}$ during a next line scanning period T', LSITs 41-21, 41-22 ... 41-2n and 41-31, 41-32 ... 41-3n connected to the second and third row lines 42-2 and 42-3, respectively are selected and successively readout. Then, video signals readout of the LSITs 41-31, 41-32 ... 41-3n are successively derived on the first video line 47, and at the same time video signals readout of the LSITs 41-21, 41-22 ... 41-2n are successively derived on the second video line 51. Then the video signal having the dark current removed therefrom is obtained at the output terminal 58 by means of the differential amplifier 54 and absolute circuit 55. Then the LSITs 41-21, 41-22 ... 41-2n and 41-31, 41-32 ... 41-3n connected to the second and third row lines 42-2 and 42-3, respectively are reset at once. In this manner, the LSITs are successively readout to derive the video signal of one field, while LSITs situating on preceding lines are readout to derive the dark current which is subtracted from the video signal by means of the differential amplifier 54.

In the present embodiment, since the dummy pixel for generating the dark current is not provided, the construction becomes simple. Further, the dark current is derived from a pixel neighboring a pixel from which the video signal is to be readout, it is possible to correct precisely the influence of the dark current, and thus the video signal having a very high S/N can be obtained.

In the embodiments shown in FIGS. 5, 7 and 8, the influence of the dark current can be removed substantially completely and the video signal having a very high S/N can be obtained. Therefore, the video signal is precisely proportional to an amount of incident light even if the intensity of the incident light is small. Moreover, since the external signal processing circuit is not required, the solid state image sensor can be made simple in construction and inexpensive in cost. Further, the variation in S/N for respective chips can be reduced and an yield of manufacturing the solid state image sensor can be improved.

The present invention is not limited to the embodiments explained above, but many modifications and alternations can be conceived by those skilled in the art without departing from the spirit of the invention defined in claims. For instance, in the above embodiments, the pixels may be formed by vertical type static induction transistors instead of the lateral type static induction transistors. Further, the conduction type of static induction transistors is not limited to n-channel, but may be set to p-channel. In the last embodiment, the dark current for correcting a video signal readout of a pixel is derived from a pixel situating on the same column, but on a preceding row. However, according to the invention, the dark current may be derived from a pixel situating on the same row, but on a preceding column.

What is claimed is:

1. A solid state image sensor comprising:
   a semiconductor substrate having a major surface;
   a number of lateral type static induction transistors constituting pixels and arranged in said semiconductor substrate in a matrix, each of said lateral type static induction transistors comprising a source and drain regions formed in said major surface of the substrate in such a configuration that a source-drain current flows in parallel with the major surface of the substrate; and
   scanning means for selecting said lateral type static induction transistors successively by a source-gate selection method and for reading out a video signal from a selected lateral type static induction transistor by a source follower configuration;
   said scanning means comprising:
      a horizontal scanning circuit having outputs for generating horizontal scanningg signals,
      a vertical scanning circuit having outputs for generating vertical scannin signals,
      a video bias voltage source to which drain terminals of all the lateral type static induction transistors are commonly connected,
      a plurality of column lines each connected to respective source terminals of lateral type static induction transistors aligned on respective columns,
      a plurality of column selection switches each connected to respective column lines and having control terminals connected to the outputs of the horizontal scanning circuit,
      a video line connected commonly to the column selection switches,
      a load resistor connected between said video line and a ground potential,
      a plurality of row lines each connected to respective outputs of the vertical scanning circuit as well as to gate terminals of lateral type static induction transistors aligned on respective rows, and
      a video output terminal connected to a junction between the video line and the load resistor.

2. An image sensor according to claim 1, wherein said column selection switches are column selection transistors having source-drain current paths connected in series with respective column lines, and having gate terminals connected to respective outputs of the horizontal scanning circuit.

3. An image sensor according to claim 2, wherein said column lines are further connected via respective anti-selection transistors to a line connected to a constant potential, and gate terminals of said anti-selection transistors are connected to said respective outputs of the horizontal scanning circuit via respective inverters.

4. An image sensor according to claim 3, wherein said constant potential is set to the ground potential.

5. An image sensor according to claim 1, wherein said semiconductor substrate is connected to a constant bias voltage source having a plurality opposite to that of the video bias voltage source.

6. An image sensor according to claim 1, wherein said lateral type static induction transistors are of n-channel type.

7. A solid state image sensor comprising:
   a semiconductor substrate;
   a number of static induction transistors constituting pixels and arranged in said semiconductor substrate in a matrix;
   scanning means for selecting the static induction transistors successively by a source-gate selection method and for reading out a video signal from a selected static induction transistor by a source follower configuration;
   means for generating a dark current which is equal to a video signal read out of a pixel upon which light input is not incident, said means for generating the dark current comprising one dummy pixel formed integrally with said semiconductor substrate, said dummy pixel comprising a dummy static induction transistor and a light shielding film formed on the dummy static induction transistor, and said dummy static induction transistor being repeatedly read out every time the pixels are read out; and
   means for subtracting said dark current from said video signal to derive a corrected video signal.

8. An image sensor according to claim 7, wherein said static induction transistors forming the pixels and said dummy static induction transistors are lateral type static induction transistors.

9. An image sensor according to claim 8, wherein said scanning means comprises:
   a horizontal scanning circuit having outputs or generating horizontal scanning signals,
   a vertical scanning circuit having ouputs for generating vertical scanning signals,
   a video bias voltage source to which drain terminals of all the lateral type static transistors are commonly connected,
   a plurality of column lines each connected to source terminals of lateral type static induction transistors aligned on respective columns, a plurality of column selection switches each connected to respective column lines and having control terminals connected to the outputs of the horizontal scanning circuit, a video line connected commonly to the column selection switches, a load resistor connected between said video line and a ground potential, a plurality of row lines each connected to respective outputs of vertical scanning circuit as well as to gate terminals of lateral type static induction transistors aligned on respective rows, and a video output terminal connected to a junction between the video line and the load resistor, a gate terminal of said dummy static induction transistor of said dark current generating means being connected to an additional output of the vertical scanning circuit for producing a logic sum signal of the vertical scanning signals, a drain terminal of said dummy static induction transistor being connected to said video bias voltage source, a source terminal of said dummy static induction transistor being connected to a dark current output line via a selection transistor having a gate terminal connected to an additional output of the horizontal scanning circuit for generating a logic sum of the horizontal scanning signals, said dark current output line being connected to the ground potential via a load resistor having the same resistance as the load resistor connected to the video line, and wherein said subtracting means comprises a differential amplifier having a first input connected to the video line and a second output connected to the dark current output line.

10. An image sensor according to claim 9, wherein said column lines are further connected via respective anti-selection transistors to a line connected to a constant potential, gate terminals of said anti-selection transistors being connected to said respective outputs of the horizontal scanning circuit via respective inverters, and the source terminal of the dummy static induction transistor being connected to said line via connected to a constant potential an anti-selection transistor having a gate terminal connected to said additional output of the horizontal scanning circuit via an inverter.

11. A solid state image sensor comprising:
a semiconductor substrate;
a number of lateral type static induction transistors constituting pixels and arranged in said semiconductor substrate in a matrix;
scanning means for selecting the static induction transistors successively by a source-gate selection method and for reading out a video signal from a selected static induction transistor by a source follower configuration;
means for generating a dark current which is equal to a video signal read out of a pixel upon which light input is not made incident, said means for generating the dark current comprising a plurality of dummy pixels aligned on a column and a light sheilding film provided on the dummy pixels, a dummy pixel belonging to a row being repeatedly read out while pixels belonging to the relevant row are successively read out, each of said dummy pixels being formed by a dummy lateral type static induction transistor; and
means for subtracting said dark current from said video signal to derive a corrected video signal.

12. An image sensor according to claim 11, wherein said scanning means comprises:
a horizontal scanning circuit having outputs for generating horizontal scanning signals,
a vertical scanning circuit having outputs for generating vertical scanning signals,
a video bias voltage source to which drain terminals of all the lateral type static induction transistors are commonly connected,
a plurality of column lines each connected to source terminals of lateral type static induction transistors aligned on respective columns,
a plurality of column selection switches each connected to respective column lines and having control terminals connected to the outputs of the horizontal scanning circuit,
a video line connected commonly to the column selection switches,
a load resistor connected between said video line and a ground potential,
a plurality of row lines each connected to respective outputs of the vertical scanning circuit as well as to gate terminals of lateral type static induction transistors aligned on respective rows, and
a video output terminal connected to a junction between the video line and the load resistor, gate terminals of the dummy lateral type static induction transistors being connected to respective row lines, drain terminals of the dummy lateral type static induction transistors being commonly connected to the video bias voltage source, source terminals of the dummy lateral type static induction transistors being connected to a dark current output line via a selection transistor having a gate terminal connected to an additional output of the horizontal scanning circuit for generating a logic sum of the horizontal scanning signals, said dark current output line being connected to the ground potential via a load resistor having the same resistance as that of the load resistor connected to the video line, and wherein said subtracting means comprises a differential amplfier having a first input connected to the video line and a second output connected to the dark current output line.

13. An image sensor according to claim 12, wherein said column lines are further connected via respective anti-selection transistors to a line connected to a constant potential, gate terminals of said anti-selection transistors being connected to said respective outputs of the horizontal scanning circuit via respective inverters, and the source terminals of the dummy lateral type static induction transistor being connected to said line connected to a constant potential via an anti-selection transistor having a gate terminal connected to said additional output of the horizontal scanning circuit via an inverter.

14. An image sensor according to claim 13, wherein said means for generating the dark current comprises means for selecting and reading out a static induction transistor which is situated near a static induction transistor to be read out and has been read out immediately before the relevant static induction transistor.

15. An image sensor according to claim 14, wherein said static induction transistor from which the dark current is to be read out belongs to the same column to which the relevant static induction transistor belongs, and belongs to a row preceding that to which the relevant static induction transistor belongs.

16. An image sensor according to claim 15, wherein said scanning means comprises:
- a horizontal scanning circuit having outputs for generating horizontal scanning signals,
- a vertical scanning circuit having outputs for generating vertical scanning signals,
- a video bias voltage source to which drain terminals of all the static induction transistors are commonly connected,
- a plurality of row lines to each of which gate terminals of static induction transistors aligned on respective rows are connected,
- a plurality of first column lines and a plurality of second column lines to each of which source terminals of alternating static induction transistors aligned on respective columns are connected,
- first and second video lines connectable to said first and second column lines, respectively via first and second column selection switches, and
- first and second load resistors connected between the ground potential and the first and second video lines, respectively, whereby said first and second column selection switches belonging to respective columns are successively driven by the horizontal scanning signals; and said subtracting means comprises
- a differential amplifier having first and second inputs connected to the first and second video lines, respectively.

17. An image sensor according to claim 16, wherein said subtracting means further comprises a circuit connected to an output of the differential amplifier for deriving an absolute value of a differential output signal from the differential amplifier.

18. An image sensor according to claim 17, wherein said static induction transistors are lateral type static induction transistors.

19. An image sensor according to claim 16, wherein each of the vertical scanning signals supplied from the vertical scanning circuit has a readout voltage level lasting substantially for two successive line periods, and has a reset voltage level interposed between the successive line periods of readout voltage level.

20. An image sensor according to claim 16, wherein said frist and second column selection switches are formed by column selection transistors, source-drain current paths of first and second column selection transistors belonging to respective columns being connected to first and second column lines belonging to respective columns, and gate terminals of the first and second column selection transistors belonging to respective columns being connected commonly to respective outputs of the horizontal scanning circuit.

21. An image sensor according to claim 20, wherein said first and second column lines are further connected via respective first and second anti-selection transistors to a line connected to a constant potential, gate terminals of said first and second anti-selection transistors being connected to respective outputs of the horizontal scanning circuit via respective inverters.

22. An image sensor according to claim 21, wherein said constant potential is set to the ground potential.

23. An image sensor according to claim 7, wherein said semiconductor substrate is connected to a constant bias voltage source having a polarity opposite to that of the video bias voltage source.

* * * * *